US009957156B2

(12) United States Patent
Chen et al.

(10) Patent No.: US 9,957,156 B2
(45) Date of Patent: May 1, 2018

(54) BOND RINGS IN SEMICONDUCTOR DEVICES AND METHODS OF FORMING SAME

(71) Applicant: Taiwan Semiconductor Manufacturing Company, Ltd., Hsin-Chu (TW)

(72) Inventors: Chih-Ming Chen, Hsin-Chu (TW); Ping-Yin Liu, Yonghe (TW); Chung-Yi Yu, Hsin-Chu (TW); Yeur-Luen Tu, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1 day.

(21) Appl. No.: 15/080,356

(22) Filed: Mar. 24, 2016

(65) Prior Publication Data
US 2017/0275153 A1 Sep. 28, 2017

(51) Int. Cl.
*H01L 29/84* (2006.01)
*B81B 7/00* (2006.01)
(Continued)

(52) U.S. Cl.
CPC .......... *B81B 7/007* (2013.01); *B81C 1/00357* (2013.01); *H01L 24/03* (2013.01); *H01L 24/09* (2013.01); *B81B 2201/0235* (2013.01); *B81B 2201/0242* (2013.01); *B81B 2201/0257* (2013.01); *B81B 2201/0264* (2013.01); *B81B 2201/052* (2013.01); *B81C 2201/013* (2013.01); *B81C 2203/036* (2013.01); *H01L 2224/02163* (2013.01); *H01L 2224/05082* (2013.01); *H01L 2224/05109* (2013.01); *H01L 2224/05117* (2013.01); *H01L 2224/05124* (2013.01); *H01L 2224/05138* (2013.01);
(Continued)

(58) Field of Classification Search
CPC ......... H01L 29/84; B81B 3/00; B81B 3/0072; B81B 3/0035; B81B 3/0064; B81B 7/0032; B81B 7/0045; B81B 7/0048; B81B 7/0051; B81B 7/007; B81B 7/0074; B81B 7/0077; B81C 1/00134; B81C 1/00222; B81C 1/0023; B81C 1/00238; B81C 1/00246; B81C 1/00253; B81C 1/00261; B81C 1/00269; B81C 1/00301; B81C 1/00333; B81C 1/00357; B81C 1/00436; B81C 1/00444; B81C 1/00492
See application file for complete search history.

(56) References Cited

U.S. PATENT DOCUMENTS 8,987,059 B2  3/2015  Liang et al.
9,040,334 B2  5/2015  Chu et al.
(Continued)

*Primary Examiner* — Steven Loke
*Assistant Examiner* — Scott Stowe
(74) *Attorney, Agent, or Firm* — Slater Matsil, LLP

(57) ABSTRACT

An embodiment method includes forming a first plurality of bond pads on a device substrate, depositing a spacer layer over and extending along sidewalls of the first plurality of bond pads, and etching the spacer layer to remove lateral portions of the spacer layer and form spacers on sidewalls of the first plurality of bond pads. The method further includes bonding a cap substrate including a second plurality of bond pads to the device substrate by bonding the first plurality of bond pads to the second plurality of bond pads.

20 Claims, 12 Drawing Sheets

(51) Int. Cl.
  *B81C 1/00*  (2006.01)
  *H01L 23/00*  (2006.01)
(52) U.S. Cl.
  CPC ............... *H01L 2224/05144* (2013.01); *H01L 2224/05147* (2013.01); *H01L 2924/01014* (2013.01); *H01L 2924/01032* (2013.01); *H01L 2924/1461* (2013.01)

(56) References Cited

U.S. PATENT DOCUMENTS

| | | |
|---|---|---|
| 9,065,358 B2 | 6/2015 | Tsai et al. |
| 9,085,455 B2 | 7/2015 | Cheng et al. |
| 9,085,456 B2 | 7/2015 | Tsai et al. |
| 9,122,827 B2 | 9/2015 | Chen et al. |
| 9,133,017 B2 | 9/2015 | Liang et al. |
| 9,138,994 B2 | 9/2015 | Peng et al. |
| 9,139,420 B2 | 9/2015 | Chang et al. |
| 9,139,423 B2 | 9/2015 | Chien et al. |
| 9,181,083 B2 | 11/2015 | Tsai et al. |
| 9,187,317 B2 | 11/2015 | Cheng et al. |
| 9,233,839 B2 | 1/2016 | Liu et al. |
| 9,236,877 B2 | 1/2016 | Peng et al. |
| 9,238,581 B2 | 1/2016 | Wu et al. |
| 2012/0149152 A1* | 6/2012 | Tsai .................... B81C 1/00333 438/113 |
| 2014/0287548 A1 | 9/2014 | Lin et al. |
| 2015/0060954 A1* | 3/2015 | Cheng ................ B81C 1/00238 257/254 |
| 2015/0137303 A1 | 5/2015 | Chou et al. |
| 2015/0175405 A1 | 6/2015 | Cheng |
| 2015/0175407 A1 | 6/2015 | Cheng et al. |
| 2015/0196912 A1 | 7/2015 | Tsai et al. |

\* cited by examiner

BOND RINGS IN SEMICONDUCTOR DEVICES AND METHODS OF FORMING SAME

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency, has grown recently, there has grown a need for smaller and more creative packaging techniques of semiconductor dies.

Micro-electromechanical systems ("MEMS") are becoming increasingly popular, particularly as such devices are miniaturized and are integrated into integrated circuit manufacturing processes. MEMS devices may be used in various applications such as microphones, accelerometers, gyroscopes, pressure sensors, inkjet printers, and the like. However, MEMS devices introduce their own unique requirements into the integration process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
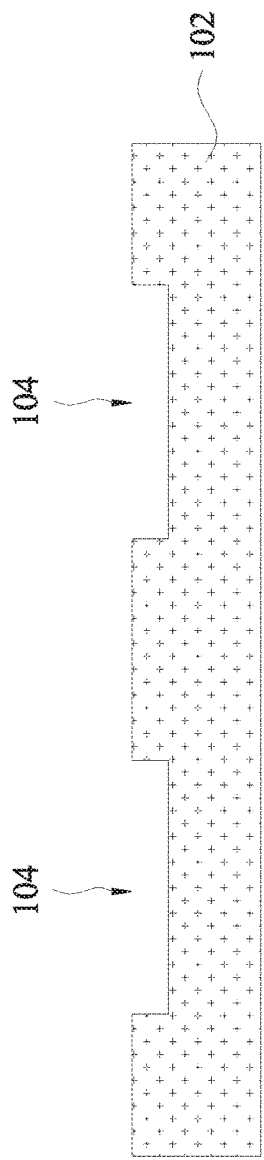
FIGS. 1A, 1B, 2, 3, 4A, 4B, and 5 through 10 illustrate cross-sectional and top down views of various intermediary stages of manufacturing a semiconductor device package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments are described within a specific context, namely micro-electromagnetic systems (MEMS) devices having sealed cavities. Various embodiments may be applied, however, to other devices where improved hermeticity of bond rings and/or improved bonding is desired.

Various embodiments include bond rings and/or bond pads, which may be bonded to other bond rings/bond pads using a eutectic bonding process. The bonded structures may form hermetically sealed cavities (e.g., having a MEMS proof mass disposed therein). Prior to bonding, spacers are formed along sidewalls of the bond rings and/or bond pads. The spacers may advantageously improve gap controllability (e.g., for improved alignment during bonding), reduce outgassing (e.g., gas leaking from the cavity due to differences between pressure levels of the sealed cavity and ambient), reduce Kirkendall voids in the bonded structure, enhance hermetic sealing of the resulting cavity, and alleviate the undesired dispersion of eutectic compound onto surrounding device features (sometimes referred to as "squeezing out" of the eutectic compound). Thus, the spacers may reduce manufacturing defects and improve reliability of the manufacturing process for the semiconductor device package.

Figure 1B:
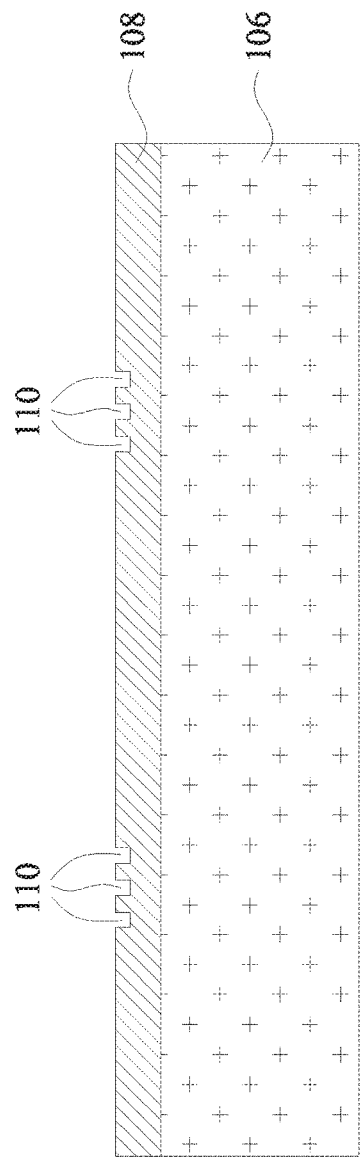

FIGS. 1A through 10 illustrate cross-sectional views of various intermediary FIGS. 1A and 1B illustrates a cross-sectional views of substrates 102 and 106, which may be subsequently bonded together to form a MEMS device package 100 (see FIG. 2) in accordance with some embodiments. FIG. 1A illustrates a carrier substrate 102, which may be used as structural support for subsequently formed MEMS devices, for example. Carrier substrate 102 may comprise any suitable material, such as, silicon although other substrates, such as ceramic substrates, silicon-on-insulator substrates, substrates comprising other semiconductor materials, and the like may also be used in other embodiments Carrier substrate 102 may be optionally patterned to include cavities 104 using a combination of photolithography and etching, for example. The photolithography process may include, for example, depositing a photoresist (not illustrated) as a blanket layer over carrier substrate 102 using a spin-on process. The photoresist may then be patterned by exposing portions of the photoresist through a lithography mask using ultraviolet light, for example. Subsequently, exposed or unexposed portions of the photoresist are developed and removed depending on whether a positive or negative resist is used.

The pattern of the photoresist may then be transferred to underlying carrier substrate 102. One or more optional hard masks (e.g., comprising an oxide, a nitride, an oxynitride, or a combination thereof) may be formed between the photoresist and carrier substrate 102 to assist in the patterning of carrier substrate 102. For example, the pattern of the photoresist may first be transferred to the hard mask(s) using a suitable etching process, for example. The hard mask(s) are then used to etch carrier substrate 102. Etching carrier substrate 102 may include a deep reactive-ion etching (DRIE) process although other suitable etching techniques may also be used. Any remaining portions of the photoresist (e.g., portions of the photoresist not removed during patterning the hard mask(s)) may be removed a plasma ashing or wet strip process. Optionally, the plasma ashing process may be followed by a wet dip in a sulfuric acid (H2SO4) solution to clean substrate 102 and remove remaining photoresist material. Removing portions of the photoresist may be performed either before or after the carrier substrate 102 is etched. The hard mask(s) may also be removed after carrier substrate 102 is patterned.

Cavities 104 may be included, for example, to accommodate a subsequently formed moveable proof mass (e.g., proof mass 120, see FIG. 7) in the MEMS device. For example, cavities 104 allow the proof mass to move on at least one axis (e.g., in a direction perpendicular to a major surface of carrier substrate 102) without contacting carrier substrate 102. Cavities 104 may also be included, for example, to control a pressure level of a subsequently formed sealed cavity including cavities 104. In other embodiments, cavities 104 are included for other purposes. In still other embodiments, cavities 104 may be omitted.

FIG. 1B illustrates cross-sectional view of a device substrate 106, which may be substantially similar to carrier substrate 102 as described above. Device substrate 106 may or may not be formed of a same material as carrier substrate 102. In subsequent process steps, device substrate 106 may be patterned to form various portions of one or more MEMS devices (e.g., see FIG. 7). For example, device substrate 106 may be patterned to include proof masses, electrodes, support members, combinations thereof, and the like of one or more MEMS devices as described in greater detail below.

A dielectric layer 108 is formed over device substrate 106 using any suitable process, such as chemical vapor deposition (CVD), plasma enhanced CVD (PECVD), atomic layer deposition (ALD), physical vapor deposition (PVD), and the like. Dielectric layer 108 may be used as a bonding layer to bond carrier substrate 102 to device substrate 106 (see e.g., FIG. 2). Furthermore, dielectric layer 108 may be used to temporarily support MEMS structures (e.g., proof masses, electrodes, and the like) during patterning of device substrate 106 (see e.g., FIG. 7). Dielectric layer 108 may be patterned to include trenches 110 using a combination of photolithography and etching as described above. Trenches 110 extend at least partially into dielectric layer 108, and trenches 110 may be included for loading reduction and/or to decrease the removal time of portions of dielectric layer 108 in subsequent process steps, for example (see e.g., FIG. 8). In other embodiments, trenches 110 may be omitted. FIGS. 1A and 1B explicitly illustrate two substrates 102/106 and a single dielectric layer 108 for simplicity only, and other embodiment device and/or carrier substrates may include any number of additional features (e.g., additional conductive and/or dielectric features) formed thereof depending on device design.

Figure 2:
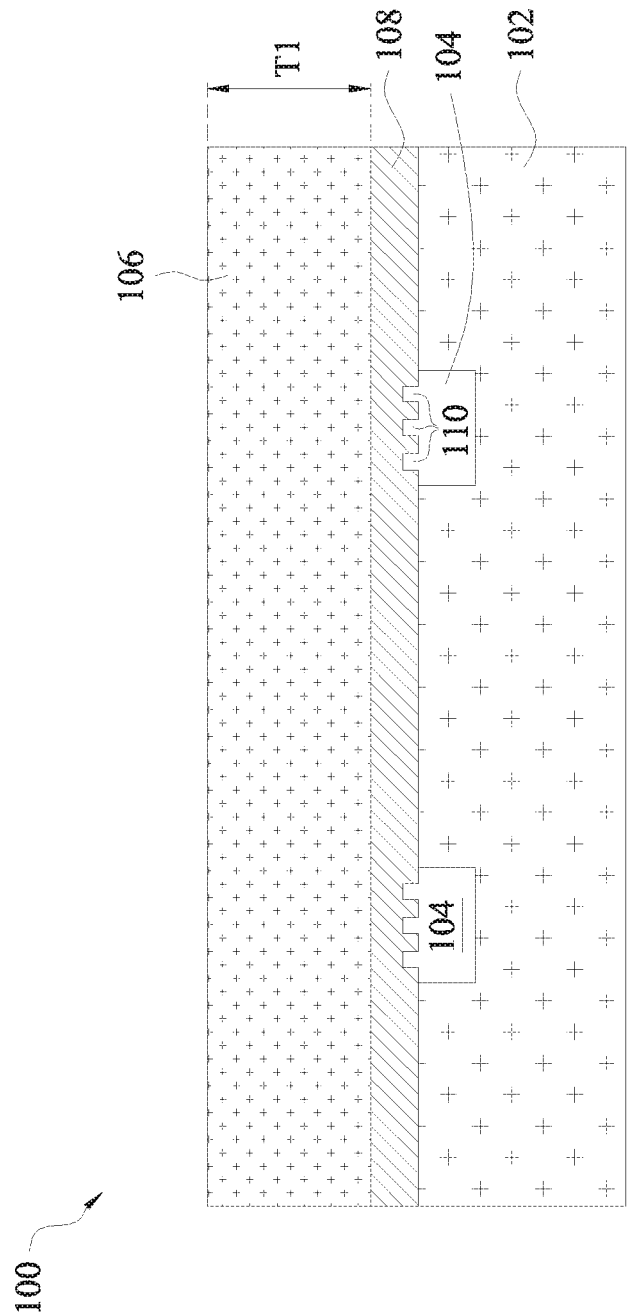

FIG. 2 illustrates the bonding of carrier substrate 102 to device substrate 106 using dielectric layer 108 as a bonding interface. The bonding process may include a fusion bonding process although other suitable processes may also be used. An anneal may be performed to enhance the bond between carrier substrate 102 and device substrate 106. In some embodiments, dielectric layer 108 of device substrate 106 is bonded to contact a surface of carrier substrate 102 having cavities 104 patterned therein. Furthermore, trenches 110 may be aligned with and disposed within cavities 104 in the bonded package 100.

As further illustrated by FIG. 2, after carrier substrate 102 and device substrate 106 are bonded, device substrate 106 may be thinned to a desired thickness T1. In some embodiments, thickness T1 may be about 10 µm to about 70 µm. Other embodiments may include device substrates with a different thickness depending on device design. Thinning device substrate 106 may be achieved using any suitable process, such as, a chemical mechanical polish (CMP) process, a mechanical grinding process, an etch-back process, combinations thereof or the like.

Figure 3:
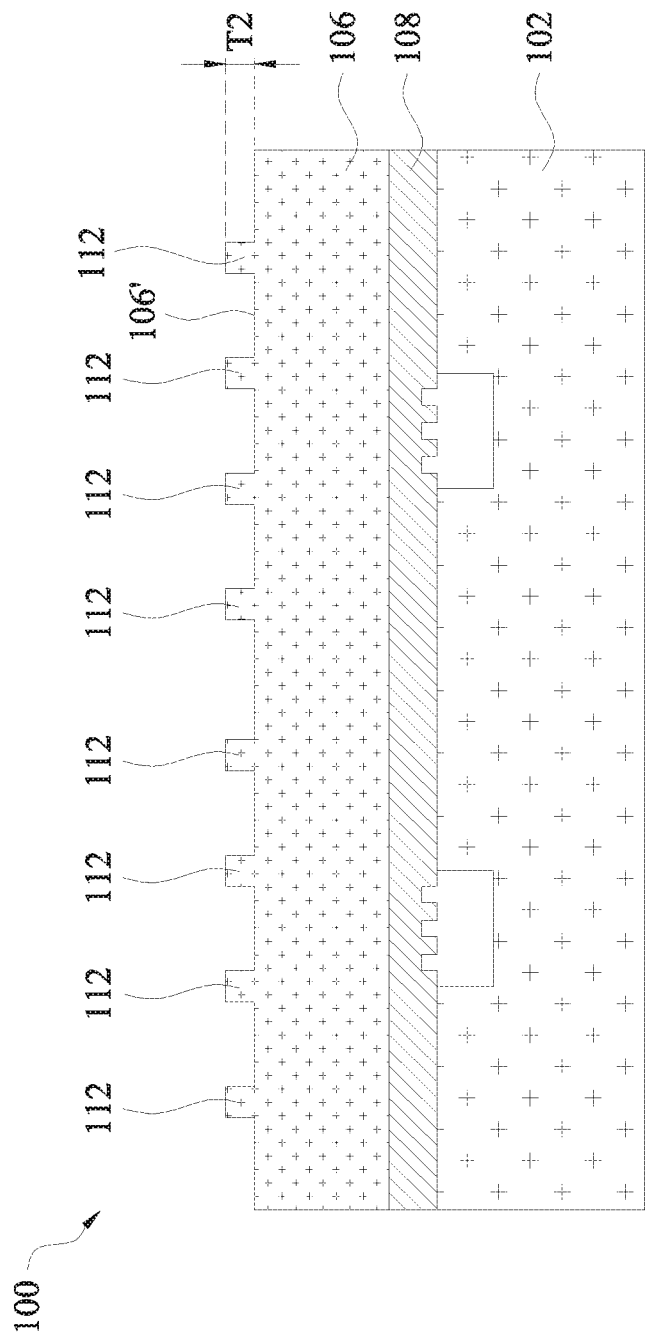

Subsequently, as illustrated by FIG. 3, device substrate 106 may be patterned to form contact areas 112. In some embodiments, device substrate 106 is patterned using a combination of photolithography and etching as described above. The patterning process may include a DRIE process although other suitable etching process(es) may also be used. Contact areas 112 may provide surfaces for subsequently formed conductive bond pads (e.g., bond pads 114 in FIG. 4A). Contact areas 112 may be included to provide a sufficient standoff height for the bond pads to avoid interference with subsequently formed MEMS structures. For example, after patterning, a top surface of contact areas 112 may be higher than a top surface 106' of portions of device substrate 106 between contact areas 112. In some embodiments, the standoff height difference T2 of contact areas 112 may be about 0.5 µm to about 2 µm.

Figure 4A:
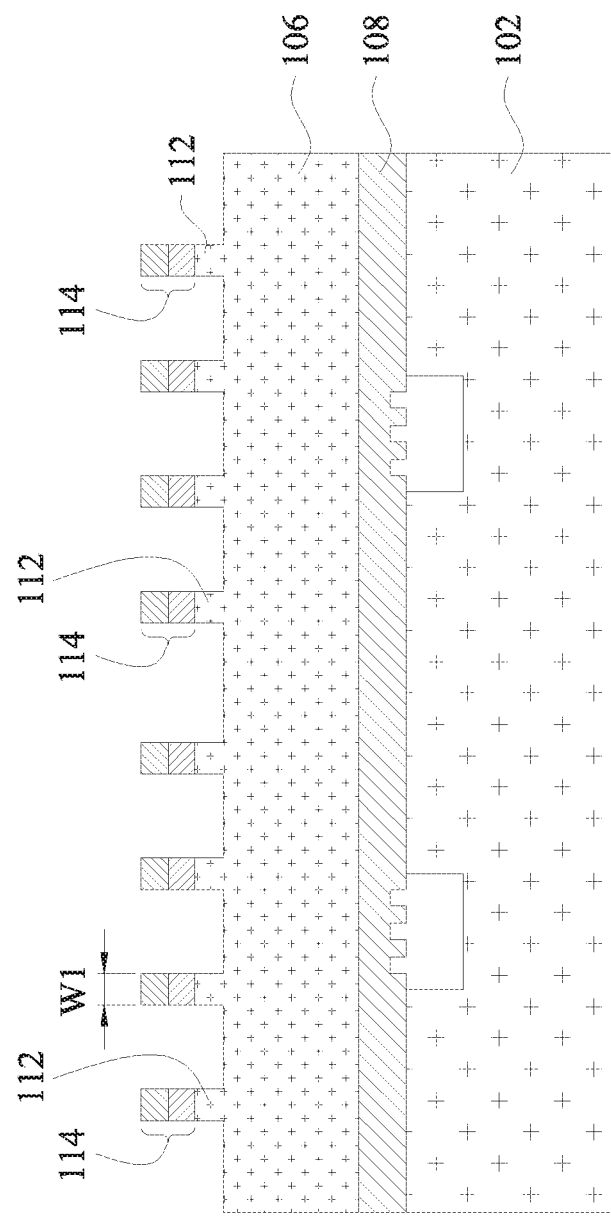
Figure 4B:
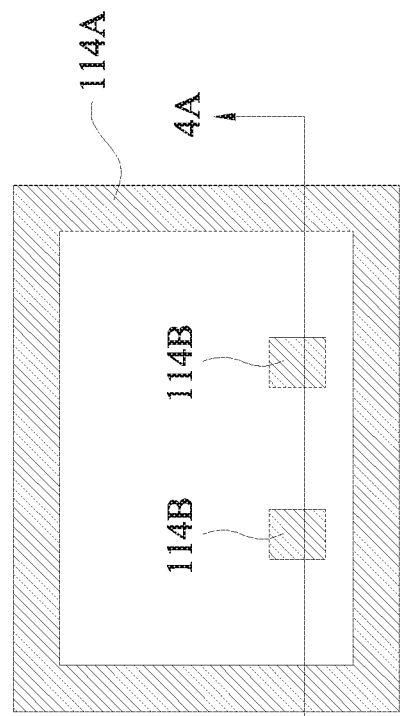
Figure 4B:
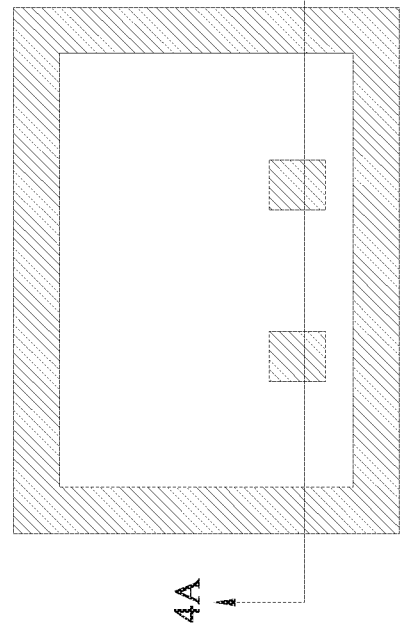

After contact areas 112 are formed, bond pads 114 may be formed on contact areas 112 as illustrated by FIGS. 4A and 4B. FIG. 4A illustrates a cross sectional view of bond pads 114 while FIG. 4B illustrates a corresponding top-down view of bond pads 114. The cross-section illustrated in FIG. 4A may be taken along line 4A-4A of FIG. 4B. Bond pads 114 may comprise one or more layers of a conductive material, which may be selected depending on desired bonding conditions (e.g., temperature, force, and the like) for bonding a package component to device substrate 106 using bond pads 114 (see e.g., FIG. 10). For example, bond pads 114 may comprise copper, a layer of gold (Au) and a layer of indium (In), a layer of aluminum (Al) and a layer of germanium (Ge), a layer of copper (Cu) and a layer of tin (Sn), a layer of gold (Au) and a layer of tin (Sn), a layer of gold (Au) and a layer of germanium (Ge), a layer of gold (Au) and a layer of silicon (Si), combinations thereof, and the like. Bond pads 114 may each have a width W1, which may be measured between sidewalls of each bond pad 114. In some embodiments, width W1 may be about 50 µm to about 60 µm.

Bond pads 114 may be formed using any suitable process. In one embodiment, bond pads 114 is deposited as one or more blanket layers by CVD, PECVD, a spin-on process, and the like. In such embodiments, the blanket layer(s) are then patterned using a combination of photolithography and etching as described above. In another embodiment, a seed layer (not shown) is deposited over device substrate 106, and a mask (e.g., a hard mask, not shown) is formed and patterned to include openings over the seed layer that define a shape of bond pads 114. For example, the openings in the mask may be aligned with contact areas 112. In such embodiments, bond pads 114 are then formed in the openings in the mask using a suitable plating process (e.g., electroless plating, electrochemical plating, and the like). Subsequently, the hard mask and excess portions of the seed layer (e.g., portions not directly underlying bond pads 114) may be removed.

As illustrated by the top-down view of FIG. 4B, at least a subset (e.g., bond pads 114A) of bond pads 114 may form a closed loop (referred to hereinafter as a bond rings 114A). In subsequent process steps, bond rings 114A may be bonded to a cap substrate to form hermetically sealed cavities (see e.g., FIG. 10). Bond rings 114A are illustrated in FIG. 4B as being rectangular; however, in other embodiments, bond rings 114A may have any shape depending on device design. Other bond pads 114 (e.g., bond pads 114B) may be used purely for electrical connection and may not form any loops.

Figure 5:
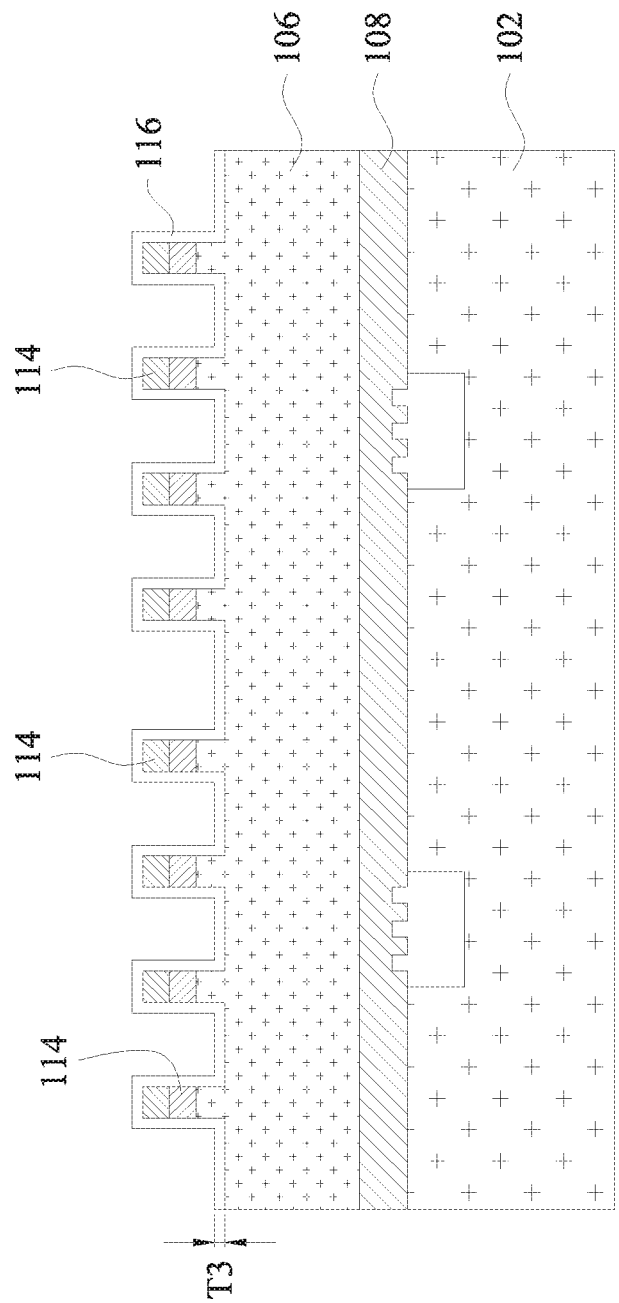

Next, in FIG. 5, a spacer layer 116 is formed over device substrate 106. Spacer layer 116 may further be disposed on a top surface and sidewalls of bond pads 114 (including bond rings 114A). Spacer layer 116 may be deposited using a conformal deposition process where vertical portions of spacer layer 116 (e.g., on sidewalls of bond pads 114) have substantially a same thickness as lateral portions of spacer layer 116 (e.g., on a top surface of bond pads 114). In some embodiments, the conformal deposition process may include CVD, PECVD, ALD, and the like. A thickness T3 of spacer layer 116 may be about 5 µm to about 10 µm, for example. It has been observed that when spacer layer 116 has a thickness in the above range, various manufacturing defects may be reduced during bonding processes as described in greater detail below. Spacer layer 116 may comprise any suitable material, such as an oxide, silicon oxynitride (SiON), silicon nitride (SiN), a metal oxide, polysilicon, undoped polysilicon, combinations thereof, and the like.

Figure 6:
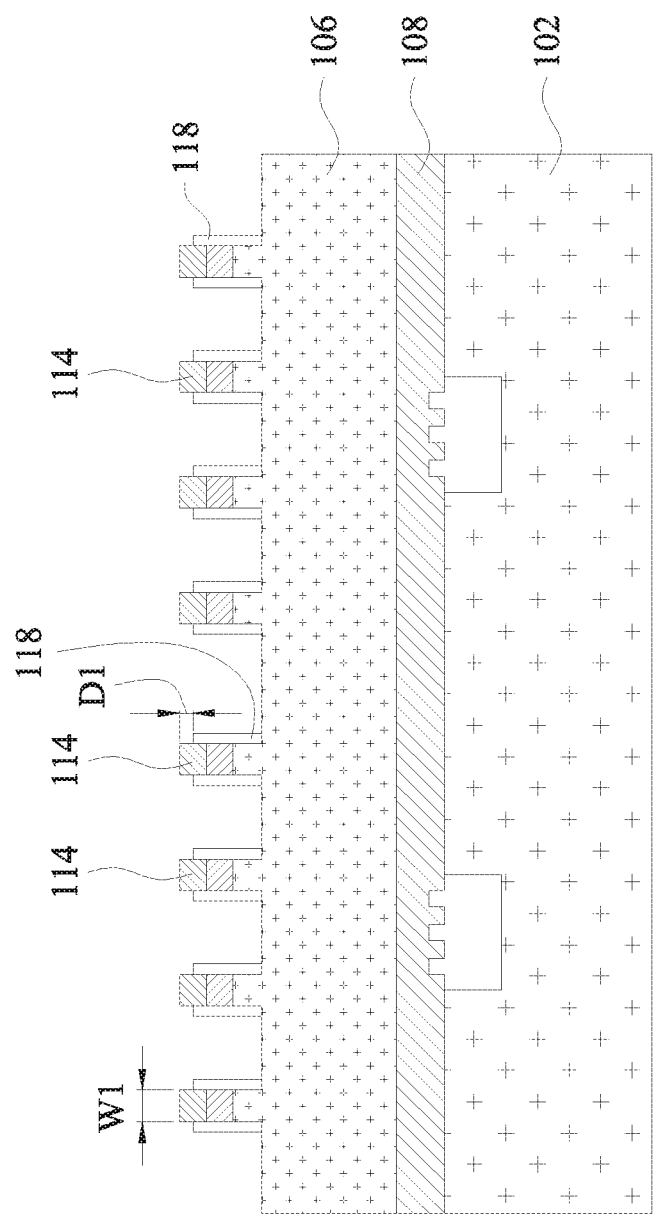

In FIG. 6, spacer layer 116 is patterned using an etch-back technique, for example to form spacers 118. The etch-back technique may remove lateral portions of spacer layer 116 while leaving vertical portions of spacer layer 116 on sidewalls of bond pads 114. The etch-back process may further recess spacer layer 116 below a top surface of bond pads in order to prevent spacers 118 from interfering in a subsequent bonding process using bonding pads 114 (e.g., see FIG. 10). In some embodiments, distance D1 (e.g., a difference in height between tops of bond pads 114 and tops of spacers 118) may be about 100A to about 200A, for example. In some embodiments, the desired profile of spacers 118 (e.g., distance D1) may be achieved by controlling a duration of the etch-back process. In subsequent process steps, spacers 118 may advantageously reduce defects during bonding processes involving bond pads 114 as explained in greater detail below.

Figure 7:
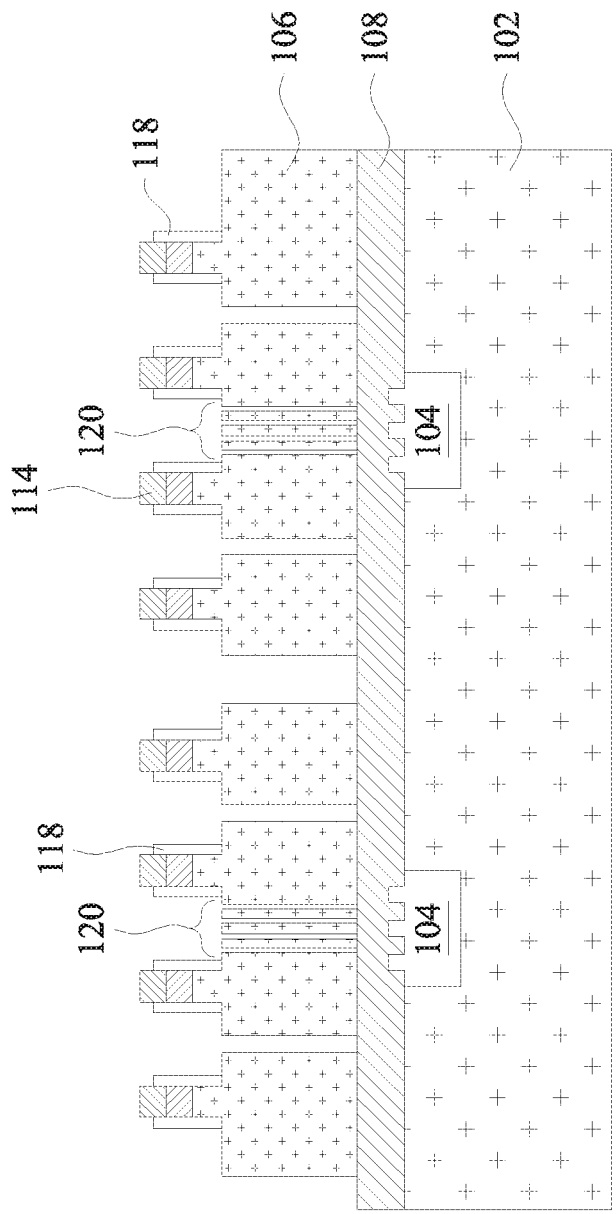

Next in FIG. 7, device substrate 106 may be patterned using a combination of photolithography and etching as described above. Device substrate 106 is patterned to define various MEMS structures 120. In an embodiment MEMS structures 120 include proof masses (e.g., a spring, a series of combs, and the like), electrodes, support members, combinations thereof, and the like. MEMS structures 120 may be aligned (e.g., disposed directly over) cavities 104 in carrier substrate 102. During patterning of device substrate 106, dielectric layer 108 may provide structural support in order to reduce damage to the various MEMS structures 120, which may arise as a result of the etching process.

Figure 8:
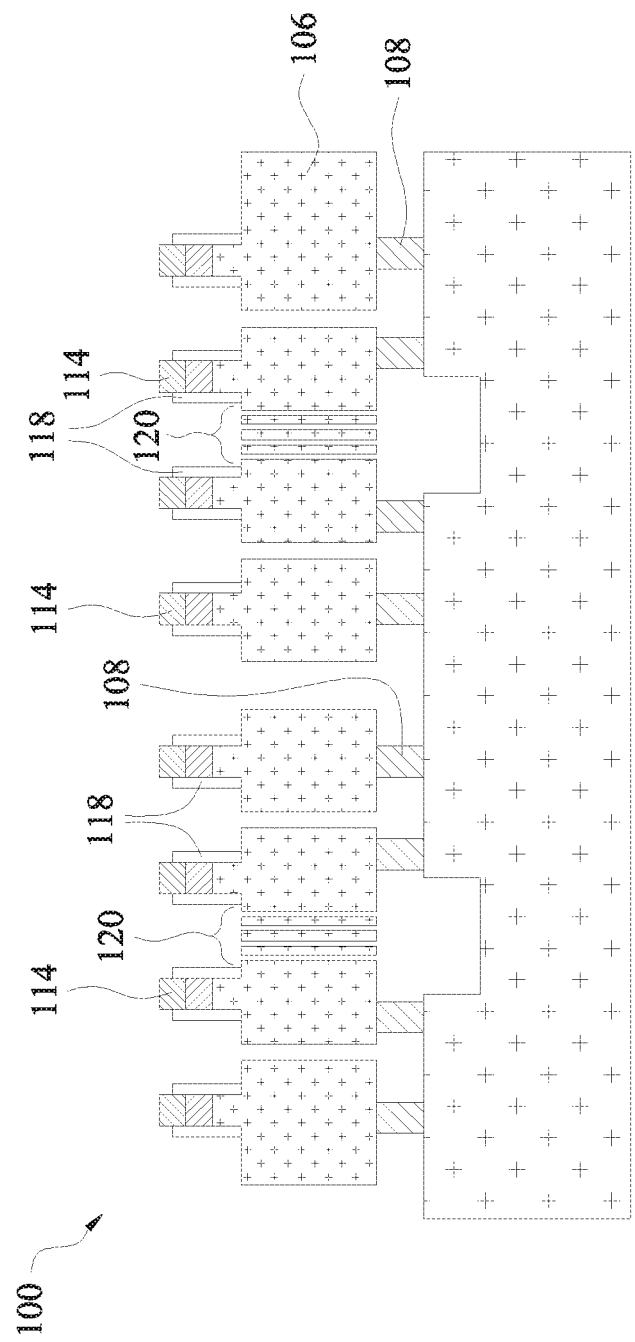

FIG. 8 illustrates the release of MEMS structures 120 by removing portions of dielectric layer 108 using any suitable process. For example, when dielectric layer 108 comprises an oxide, a vapor hydrogen-fluoride (HF) etch process may be used to remove portions of dielectric layer 108 and release MEMS structures 120. The vapor HF etch process may be etch selective between the material of device substrate 106 (e.g., silicon) and the material of dielectric layer 108 (e.g., an oxide). For example, the vapor HF etch process may etch the dielectric layer 108 at a greater rate than the device substrate 106 (and MEMS structures 120). Thus, portions of dielectric layer 108 may be removed without significantly etching MEMS structures 120/device substrate 106. Other etching processes that can selectively etching dielectric layer 108 over device substrate 106 may also be used in other embodiments.

The removal of portions of dielectric layer 108 allows for free movement of the movable elements of MEMS structures 120 in at least one axis. It should be noted that the portions of dielectric layer 108 removed depend on layout design. MEMS structures 120 may provide any suitable function depending on device design. For example, MEMS structures 120 may be parts of microphones, accelerometers, gyroscopes, pressure sensors, inkjet printers, combinations thereof, and the like.

Figure 9:
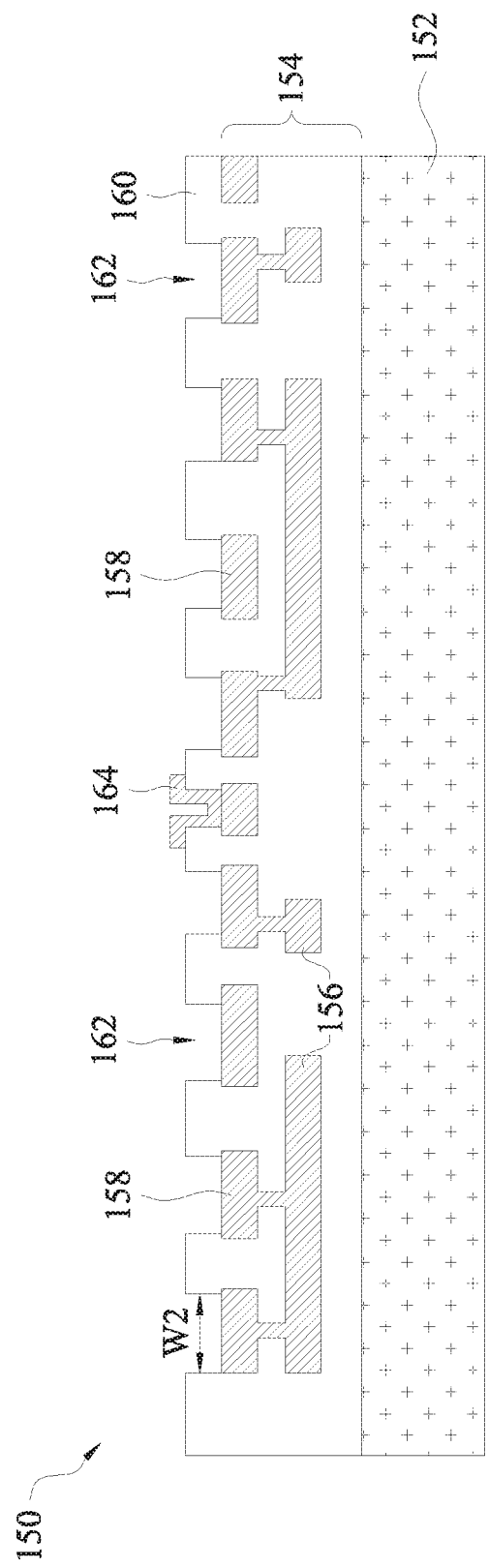

FIG. 9 illustrates a cross-sectional view of a cap substrate 150, which may be subsequently bonded to carrier substrate 102 and device substrate 106 using bond pads 114 (see FIG. 10). In some embodiments, cap substrate 150 is a complementary metal-oxide semiconductor (CMOS) chip or a CMOS wafer comprising functional circuits. For example, cap substrate 150 may comprise a semiconductor substrate 152. Semiconductor substrate 152 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, semiconductor substrate 152 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Active devices (not shown) such as transistors, capacitors, resistors, diodes, photo-diodes, fuses, and the like may be formed at the top surface of semiconductor substrate 152. Interconnect structure 154 may be formed over the active devices and semiconductor substrate 152. Interconnect structure 154 may include inter-layer dielectric (ILD) and/or inter-metal dielectric (IMD) layers containing conductive features 156 (e.g., conductive lines and vias) formed using any suitable method. The ILD and IMD layers may include low-k dielectric materials having k values, for example, lower than about 4.0 or even 2.0 disposed between such conductive features. In some embodiments, the ILD and IMD layers may be made of, for example, phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like, formed by any suitable method, such as spinning, chemical vapor deposition (CVD), and plasma-enhanced CVD (PECVD).

Conductive features 156 may be formed by a damascene process, such as single damascene or a dual damascene process. Conductive features 156 are formed of a conductive material (e.g., comprising copper, aluminum, tungsten, combinations thereof, and the like), and conductive features 156 may be lined with a diffusion barrier layer and/or an adhesion layer (not shown). The diffusion barrier layer may be formed of one or more layers of TaN, Ta, TiN, Ti, CoW, or the like. Conductive features 156 in interconnect structure 154 electrically connects various active devices to form functional circuits within cap substrate. The functions provided by such circuits may include memory structures, processing structures, sensors, amplifiers, power distribution, input/output circuitry, or the like. One of ordinary skill in the art will appreciate that the above examples are provided for illustrative purposes only to further explain applications of the various embodiments and are not meant to limit the present invention in any manner. Other circuitry may be used as appropriate for a given application.

It should also be noted that one or more etch stop layers (not shown) may be positioned between adjacent ones of the ILD and IMD layers. Generally, the etch stop layers provide a mechanism to stop an etching process when forming vias and/or contacts. The etch stop layers are formed of a dielectric material having a different etch selectivity from adjacent layers, e.g., the underlying semiconductor substrate 152 and the overlying interconnect structure 154. In an embodiment, the etch stop layers may be formed of SiN, SiCN, SiCO, CN, combinations thereof, or the like, deposited by CVD or PECVD techniques.

I/O and passivation features may be formed over interconnect structure 154. For example, bond pads 158 may be formed over interconnect structure 154 and may be electrically connected to the active devices through conductive features 156 in interconnect structure 154. Bond pads 158 may comprise a conductive material such as aluminum, copper, nickel, combinations thereof, and the like. Other materials (e.g., similar to the materials of bond pads 114) may also be used. Furthermore, a passivation layer 160 may be formed over interconnect structure 154 and the bond pads 158. In some embodiments, passivation layer 160 may be formed of non-organic materials such as silicon oxide, un-doped silicate glass, silicon oxynitride, and the like. Other suitable passivation materials may also be used. Portions of passivation layer 160 may cover edge portions of bond pads 158, and bond pads 158 may be exposed by openings 162 in passivation layer 160.

Figure 10:
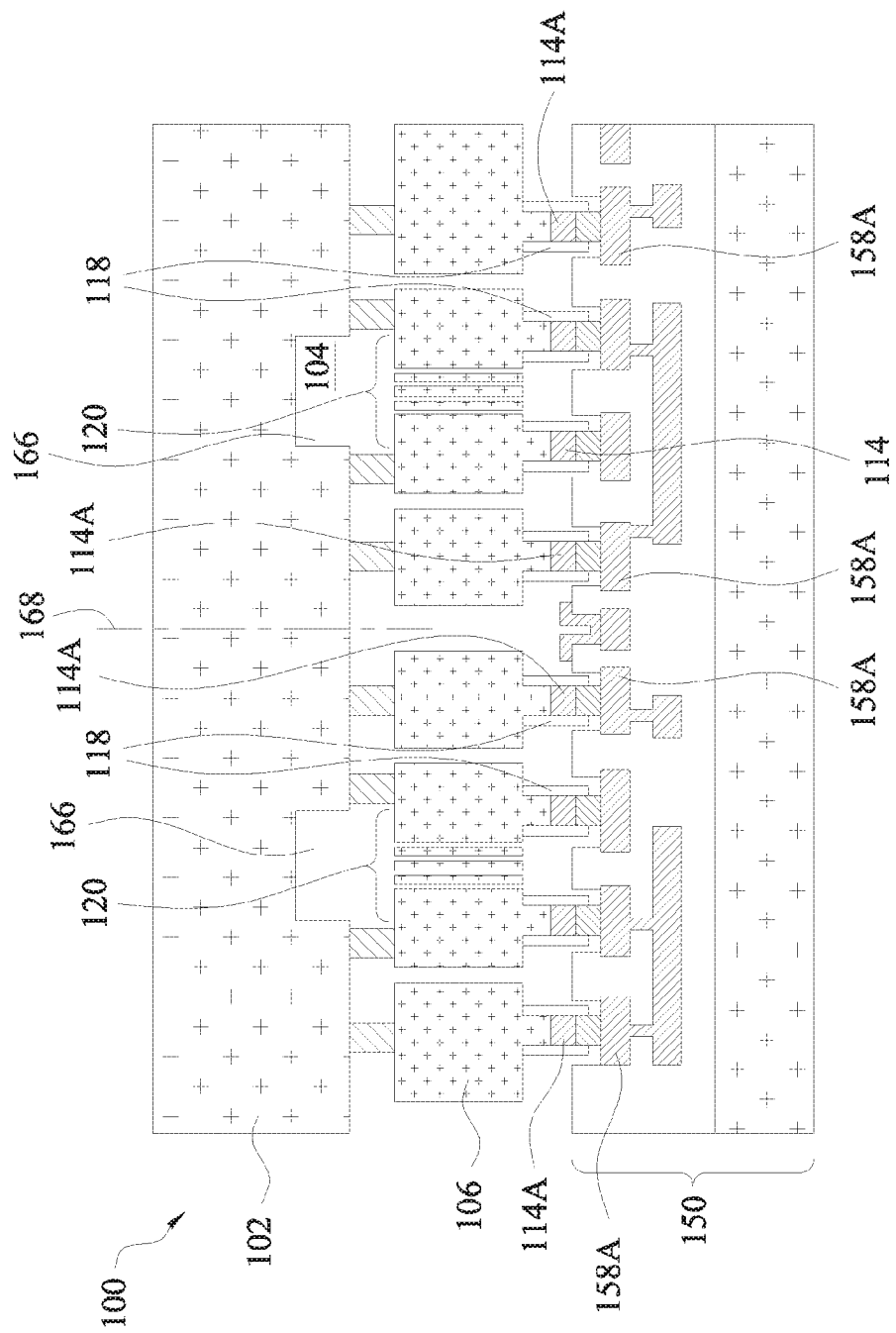

In various embodiments bond pads 158 may be bonded to bond pads 114 of device substrate 106 in subsequent process steps (see FIG. 10). Bond pads 158 may have a similar shape as corresponding bond pads 114, such as the shape illustrated in the top-down view of FIG. 4B. For example, at least a subset of bond pads 158 may form a closed loop in order to provide a bond ring structure in a top down view. Furthermore, openings 162 may be sufficiently wide (e.g., having widths W2) in order to accommodate bond pads 114 and spacers 118. For example, in embodiments where width W1 (see FIG. 4) of bond pads 114 is about 50 μm to about 60 μm, width W2 of openings 162 may be about 70 μm to about 80 μm. Other dimensions may be used in other embodiments depending on device design.

Additional interconnect features, such as additional passivation layers, conductive pillars, and/or under bump metallurgy (UBM) layers, may also be optionally formed in cap substrate 150. For example, cap substrate 150 may include additional contact pads 164, which may comprise aluminum copper, for example. The various features of cap substrate may be formed by any suitable method and are not described in further detail herein. Furthermore, the general features and configuration of cap substrate 150 described above are but one example embodiment, and cap substrate 150 may include any combination of any number of the above features as well as other features. For example, anti-stiction bumps (not shown) may be formed in passivation layer 160.

FIG. 10 illustrates the bonding of cap substrate 150 to device substrate 106 and carrier substrate 102. In an embodiment, the bonding process includes an eutectic bonding process where bond pads 158 are directly bonded to bond pads 114. Bond pads 114 and spacers 118 on sidewalls of bond pads 114 may extend at least partially into openings 162 in passivation layer 160. Because spacers 118 were previously recessed below a top surface of bond pads 114 (see FIG. 6), spacers 118 may not contact bond pads 158. Thus, spacers 118 may not significantly affect the bond formed between bond pads 114 and 158. The eutectic bonding process may form sealed cavities 166 having MEMs structures 120 disposed therein by bonding bond rings 114A to corresponding seal rings 158A. In some embodiments, sealed cavities 166 may further include cavities 104 of carrier substrate 102. Furthermore, in embodiments where cap substrate 150 includes anti-stiction bumps (not shown), the anti-stiction bumps may also be disposed in sealed cavities 166 and aligned with MEMS structures 120. After bonding, additional processing steps may be performed, such as singulation of individual MEMS devices from MEMS device package 100. The singulation process may be a multi-step process where a partial singulation (e.g., along scribe line 168) is first performed prior to fully singulating individual devices from package 100.

In various embodiments, spacers 118 reduce defects that may otherwise occur during the bonding process. For example, spacers 118 may reduce the amount of conductive material dispersal (referred to as "squeezing out") from bond pads 114 and 158. Furthermore, spacers 118 may advantageously improve gap controllability and sealing during bonding. Additionally, spacers 118 on seal rings 114A/158A may reduce Kirkendall voids and reduce the outgassing effect in the bonding structure, which may improve the hermetic sealing of sealed cavities 166.

Figure 11:
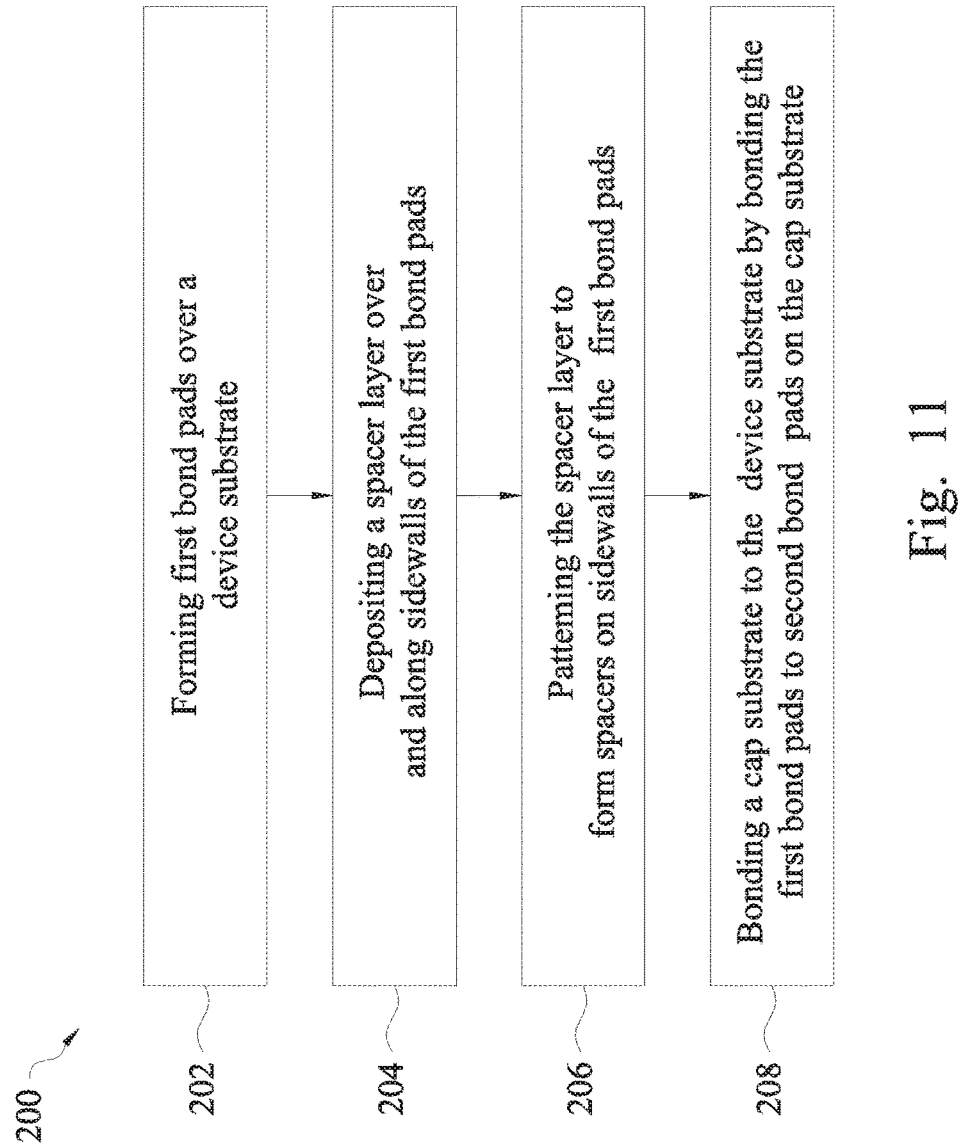
FIG. 11 illustrates a process flow for manufacturing a semiconductor device package in accordance with some embodiments.

FIG. 11 illustrates a process flow 200 for forming a device package according to some embodiments. In step 202, first bond pads (e.g., bond pads 114) are formed over a device substrate (e.g., device substrate 106). The first bond pads may be formed on contact areas (e.g., contact areas 112) patterned in the device substrate. The device substrate may further be bonded to a carrier substrate (e.g., carrier substrate 102) having cavities (e.g., cavities 104) patterned therein. A portion of the first bond pads may from a closed loop (e.g., such as bond rings 114A). Next, in step 204, a spacer layer (e.g., spacer layer 116) is deposited over and extending along sidewalls of the bond pads. In step 206, the spacer layer is patterned to form spacers (e.g., spacers 118) on sidewalls of the first bond pads. Patterning the spacer layer may include removing the lateral portion may include an etch back process, which may further recess the spacers below a top surface of the first bond pads. In step 208, a cap substrate (e.g., cap substrate 150) is bonded to the device substrate by bonding the first bond pads to second bond pads (e.g., bond pads 158) on the cap substrate. The bonding process may include a eutectic bonding process, which forms sealed cavities (e.g., cavities 166).

Thus, as described above, various embodiment device packages include a spacers formed on sidewalls of bond pads/bond rings. The spacers reduce the risk of manufacturing defects which may occur during eutectic bonding processes involving the bond pads/bond rings. For example, the spacers may improve gap controllability, reduce Kirkendall voids, reduce outgassing, reduce squeezing out of eutectic compounds, improve the hermeticity of sealed cavities defined by the bond rings, and the like.

In accordance with an embodiment, a method includes forming a first plurality of bond pads on a device substrate, depositing a spacer layer over and extending along sidewalls of the first plurality of bond pads, and etching the spacer layer to remove lateral portions of the spacer layer and form spacers on sidewalls of the first plurality of bond pads. The method further includes bonding a cap substrate including a second plurality of bond pads to the device substrate by bonding the first plurality of bond pads to the second plurality of bond pads.

In accordance with another embodiment, a method includes bonding a device substrate to a carrier substrate, patterning a surface of the device substrate opposing the carrier substrate to form a contact area, and forming a first bond ring on the contact area. The method further includes depositing a spacer layer over and along sidewalls of the first bond ring and patterning the spacer layer to define spacers on sidewalls of the first bond ring. Patterning the spacer layer includes recessing tops of the spacers below a top surface of the first bond ring. The method further includes patterning the device substrate to define a micro-electromechanical systems (MEMS) structure and eutectically bonding the first bond ring to a second bond ring on a cap substrate. Bonding the first bond ring to the second bond ring defines a sealed cavity having the MEMS structure disposed therein.

In accordance with yet an embodiment, a package includes a device substrate having a micro-electromechanical systems (MEMS) structure, a first bond ring on the device substrate, and spacers disposed on sidewalls of the first bond ring. The package further includes a cap substrate bonded to the device substrate. The cap substrate includes a second bond ring bonded to the first bond ring, and the first bond ring and the second bond ring defines a sealed cavity comprising the MEMS structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first plurality of bond pads on a device substrate, wherein top surfaces of the first plurality of bond pads are above a topmost surface of the device substrate;
    depositing a spacer layer over and extending along sidewalls of the first plurality of bond pads;
    etching the spacer layer to remove lateral portions of the spacer layer and form spacers on sidewalls of the first plurality of bond pads, wherein etching the spacer layer further comprises etching back tops of the spacers below the top surfaces of the first plurality of bond pads, and wherein, after the etching back, the tops of the spacers are above the topmost surface of the device substrate; and
    bonding a cap substrate comprising a second plurality of bond pads to the device substrate by bonding the first plurality of bond pads to the second plurality of bond pads.

2. The method of claim 1, wherein bonding the first plurality of bond pads to the second plurality of bond pads comprises an eutectic bonding process.

3. The method of claim 1, wherein the cap substrate further comprises a passivation layer comprising a plurality of openings, wherein each of the plurality of openings exposes one of the second plurality of bond pads, and wherein bonding the first plurality of bond pads to the second plurality of bond pads comprises disposing the first plurality of bond pads at least partially within the plurality of openings.

4. The method of claim 1, wherein at least one of the first plurality of bond pads is a first bond ring, wherein at least one of the second plurality of bond pads is a second bond ring, and wherein bonding the first plurality of bond pads to the second plurality of bond pads comprises bonding the first bond ring to the second bond ring to form a sealed cavity.

5. The method of claim 4 further comprising:
    patterning the device substrate to define a micro-electromechanical systems (MEMS) structure; and
    releasing the MEMS structure, wherein bonding the first bond ring to the second bond ring comprises disposing the MEMS structure in the sealed cavity.

6. The method of claim 1, wherein the spacer layer comprises an oxide, silicon oxynitride (SiON), silicon nitride (SiN), a metal oxide, polysilicon, undoped polysilicon, or a combination thereof.

7. The method of claim 1, wherein the first plurality of bond pads comprises copper, a layer of gold (Au) and a layer of indium (In), a layer of aluminum (Al) and a layer of germanium (Ge), a layer of copper (Cu) and a layer of tin (Sn), a layer of gold (Au) and a layer of tin (Sn), a layer of gold (Au) and a layer of germanium (Ge), a layer of gold (Au) and a layer of silicon (Si), or a combination thereof.

8. A method comprising:
    bonding a device substrate to a carrier substrate;
    patterning a surface of the device substrate opposing the carrier substrate to form a contact area;
    forming a first bond ring on the contact area;
    depositing a spacer layer over and along sidewalls of the first bond ring;
    patterning the spacer layer to define spacers on sidewalls of the first bond ring, wherein patterning the spacer layer further comprises recessing tops of the spacers below a top surface of the first bond ring, wherein the spacers extend above a topmost surface of the device substrate after the recessing, and wherein the topmost surface of the device substrate is a farthest surface of the device substrate away from the carrier substrate;
    patterning the device substrate to define a micro-electromechanical systems (MEMS) structure; and
    eutectically bonding the first bond ring to a second bond ring on a cap substrate, wherein bonding the first bond ring to the second bond ring defines a sealed cavity having the MEMS structure disposed therein.

9. The method of claim 1, wherein, after the etching back, a distance between the tops of the spacers and the top surfaces of the first plurality of bond pads is between about 100 Å and about 200 Å.

10. The method of claim 9, wherein the cap substrate further comprises a passivation layer having an opening exposing the second bond ring, and wherein bonding the first bond ring to the second bond ring comprises disposing the first bond ring and the spacers at least partially in the opening.

11. The method of claim 9, wherein the depositing the spacer layer comprises depositing a layer comprising an oxide, silicon oxynitride (SiON), silicon nitride (SiN), a metal oxide, polysilicon, undoped polysilicon, or a combination thereof.

12. The method of claim 9, wherein bonding the device substrate to the carrier substrate comprises a fusion bonding process using a dielectric layer on the carrier substrate as a bonding interface.

13. The method of claim 12 further comprising releasing the MEMS structure by removing portions of the dielectric layer.

14. A package comprising:
a device substrate comprising a micro-electromechanical systems (MEMS) structure, wherein the device substrate comprises a contact area;
a first bond ring on the device substrate, wherein the first bond ring is disposed on the contact area, and wherein each of sidewalls of the first bond ring are aligned with a respective one of sidewalls of the contact area;
spacers disposed on the sidewalls of the first bond ring and on the sidewalls of the contact area; and
a cap substrate bonded to the device substrate, wherein the cap substrate comprises a second bond ring bonded to the first bond ring, and wherein the first bond ring and the second bond ring defines a sealed cavity comprising the MEMS structure.

15. The package of claim 14, wherein the cap substrate comprises a passivation layer extending higher than the second bond ring, wherein the first bond ring extends below a top surface of the passivation layer.

16. The package of claim 14, wherein the spacers comprise an oxide, silicon oxynitride (SiON), silicon nitride (SiN), a metal oxide, polysilicon, undoped polysilicon, or a combination thereof.

17. The package of claim 14, further comprising a carrier substrate bonded to an opposing side of the device substrate from the cap substrate.

18. The package of claim 14, wherein bottoms of the spacers are higher than a bottom surface of the first bond ring.

19. The package of claim 14, wherein each of the spacers comprise a width of about 5 μm to about 10 μm.

20. The package of claim 14, wherein the spacers extend across an interface between the first bond ring and the contact area.

* * * * *